(12) United States Patent
Oba

(10) Patent No.: US 9,844,140 B2
(45) Date of Patent: Dec. 12, 2017

(54) ELECTRONIC DEVICE

(71) Applicant: Mitsubishi Electric Corporation, Tokyo (JP)

(72) Inventor: Tetsuya Oba, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 180 days.

(21) Appl. No.: 14/839,115

(22) Filed: Aug. 28, 2015

(65) Prior Publication Data

US 2016/0262272 A1  Sep. 8, 2016

(30) Foreign Application Priority Data

Mar. 2, 2015  (JP) ................................ 2015-040039

(51) Int. Cl.
| | |
|---|---|
| *H05K 7/00* | (2006.01) |
| *H05K 1/18* | (2006.01) |
| *H05K 5/00* | (2006.01) |
| *H05K 5/06* | (2006.01) |

(52) U.S. Cl.
CPC .............. *H05K 1/18* (2013.01); *H05K 5/0052* (2013.01); *H05K 5/061* (2013.01)

(58) Field of Classification Search
CPC ......... H05K 1/18; H05K 5/0052; H05K 5/061
See application file for complete search history.

(56) References Cited

U.S. PATENT DOCUMENTS

| | | | | |
|---|---|---|---|---|
| 6,407,925 | B1* | 6/2002 | Kobayashi | ........... H05K 5/0052 200/61.88 |
| 9,468,119 | B2* | 10/2016 | Beck | .................... H05K 5/0052 |
| 2005/0185381 | A1* | 8/2005 | Ono | .................... H05K 9/0015 361/715 |
| 2006/0054335 | A1* | 3/2006 | Rapp | .................... G01G 21/283 174/481 |

FOREIGN PATENT DOCUMENTS

| | | |
|---|---|---|
| JP | 58-177995 U | 11/1983 |
| JP | 8-148842 A | 6/1996 |
| JP | 11-330739 A | 11/1999 |
| JP | 2015-15385 A | 1/2015 |

OTHER PUBLICATIONS

Communication dated Dec. 8, 2015 from the Japanese Patent Office in counterpart application No. 2015-040039.

\* cited by examiner

*Primary Examiner* — Yuriy Semenenko
(74) *Attorney, Agent, or Firm* — Sughrue Mion, PLLC; Richard C. Turner

(57) ABSTRACT

Provided is an electronic device capable of preventing stress from being generated in each of joining portions of electronic circuit components joined to a printed circuit board, thereby preventing breakage in each of the joining portions. The electronic device includes a printed circuit board (1), and a housing having the printed circuit board (1) received therein. A rubber packing (4), which is interposed between a case main body (2) and a cover (3), is elastically compressed due to a fastening force of case-and-cover fastening (Continued)

screws (31) so that a packing main body (4*a*) hermetically seals an inside of the housing. Packing projecting portions (45) of the rubber packing (4) press circuit-board protruding portions (15), to thereby hold the printed circuit board (1) inside the housing.

7 Claims, 3 Drawing Sheets

ELECTRONIC DEVICE

BACKGROUND OF THE INVENTION

1. Field of the Invention

The present invention relates to an electronic device including a printed circuit board having electronic circuit components mounted thereon, and a housing having the printed circuit board received therein.

2. Description of the Related Art

Hitherto, an electronic device including a printed circuit board, a case, and a cover has been known. The printed circuit board has a plurality of electronic circuit components mounted thereon by soldering at joining portions, and also has a surface on which conductive members are exposed. The case has the printed circuit board received therein. The cover is formed of a conductive member opposed to the surface of the printed circuit board on which the conductive members are exposed. The printed circuit board is fixed to each of the case and the cover with screws. Terminals of a connector are inserted into through holes of the printed circuit board so that the connector is electrically connected to an electronic circuit in the printed circuit board. This electronic device is disclosed in, for example, Japanese Patent Application Laid-open No. Hei 8-148842 (FIG. 2 and FIG. 3).

However, in the above-mentioned electronic device, the printed circuit board is fixed to each of the case and the cover with screws, and hence the following problems have arisen.

(a) Stress may be generated in each of the joining portions of the electronic circuit components due to an error in dimensions including warpage of the printed circuit board or an error in a mounting position of the printed circuit board, thereby causing breakage in each of the joining portions.

(b) The printed circuit board may be warped due to differences in thermal expansion between the printed circuit board and the case and between the printed circuit board and the cover so that stress is generated in each of the joining portions of the electronic circuit components, thereby causing breakage in each of the joining portions.

SUMMARY OF THE INVENTION

The present invention has been made to solve the above-mentioned problems, and has an object to provide an electronic device capable of preventing stress from being generated in each of joining portions of electronic circuit components joined to a printed circuit board, thereby preventing breakage in each of the joining portions.

According to one embodiment of the present invention, there is provided an electronic device, including:
a printed circuit board having an electronic circuit component mounted thereon; and
a housing having the printed circuit board received therein, the housing including:
a first housing portion;
a second housing portion arranged so as to be opposed to the first housing portion, for closing an inside of the housing in cooperation with the first housing portion;
a fastening member for fastening the first housing portion and the second housing portion to each other; and
an annular sealing member having elasticity, which is interposed between the first housing portion and the second housing portion,
the first housing portion including:
a housing main body; and
a housing protruding portion protruding inward from the housing main body,
the printed circuit board including:
a circuit-board main body; and
a circuit-board protruding portion protruding outward from the circuit-board main body to overlap with the housing protruding portion,
the annular sealing member including:
a seal main body interposed between the housing main body and the second housing portion; and
a circuit-board holding portion protruding inward from the seal main body to overlap with the circuit-board protruding portion,
the annular sealing member being elastically compressed due to a fastening force of the fastening member so that the seal main body hermetically seals the inside of the housing, the circuit-board holding portion of the annular sealing member pressing the circuit-board protruding portion against the housing protruding portion, to thereby hold the printed circuit board inside the housing.

In the electronic device according to the one embodiment of the present invention, the sealing member is elastically compressed due to the fastening force of the fastening member so that the seal main body hermetically seals the inside of the housing, and the circuit-board holding portion of the sealing member presses the circuit-board protruding portion against the housing protruding portion, to thereby hold the printed circuit board inside the housing.

Therefore, through the elastic deformation of the sealing member interposed between the second housing portion and the printed circuit board, the error in the dimensions of the printed circuit board and the error in the mounting position thereof are absorbed. Thus, the stress is not generated in each of the joining portions of the electronic circuit components joined to the printed circuit board, thereby preventing breakage in each of the joining portions.

DETAILED DESCRIPTION OF THE PREFERRED EMBODIMENTS

First Embodiment

Figure 1:
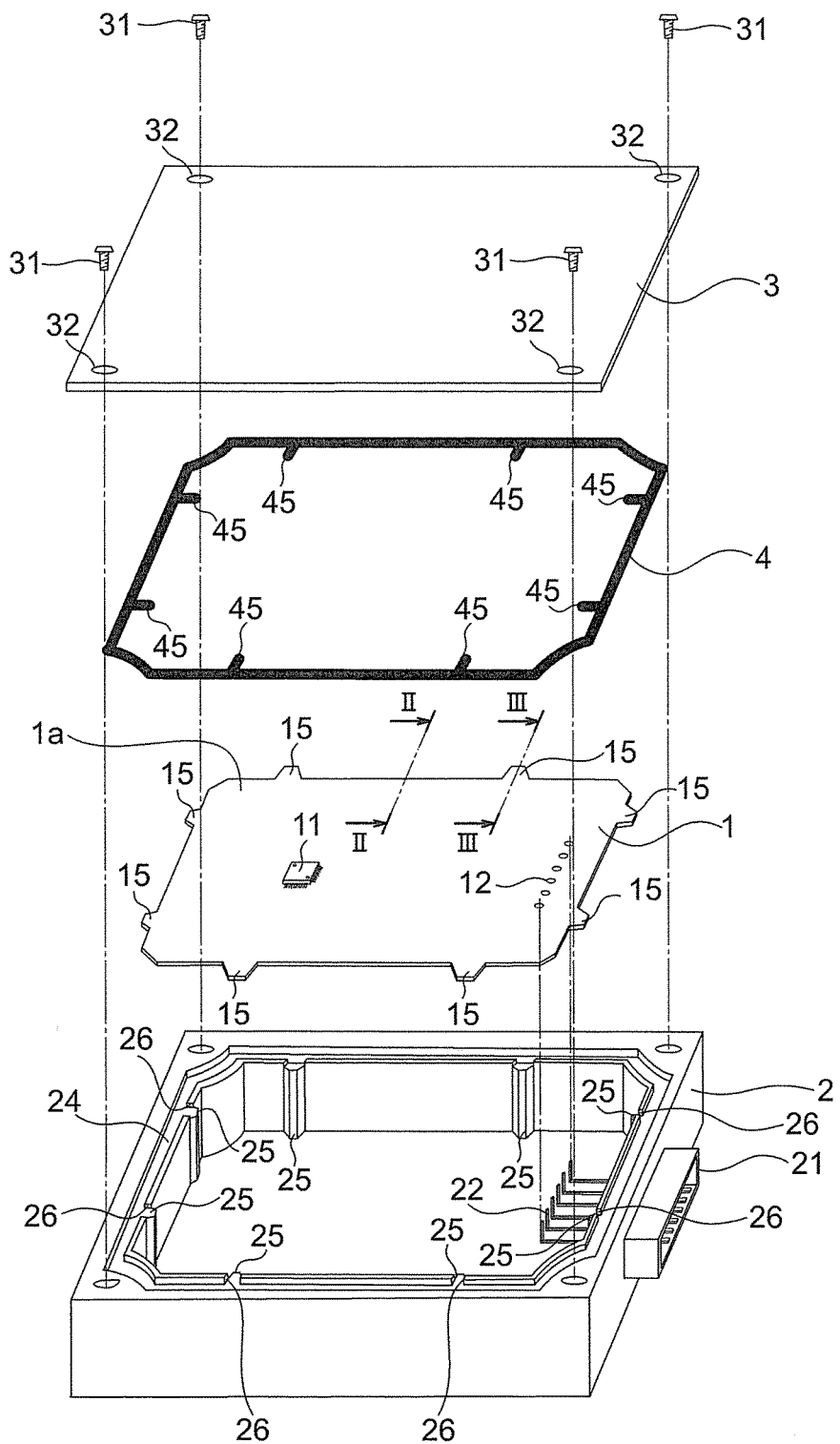
FIG. 1 is an exploded perspective view for illustrating the above-mentioned electronic device.

Now, an electronic device according to a first embodiment of the present invention is described referring to the drawings.

Figure 2:
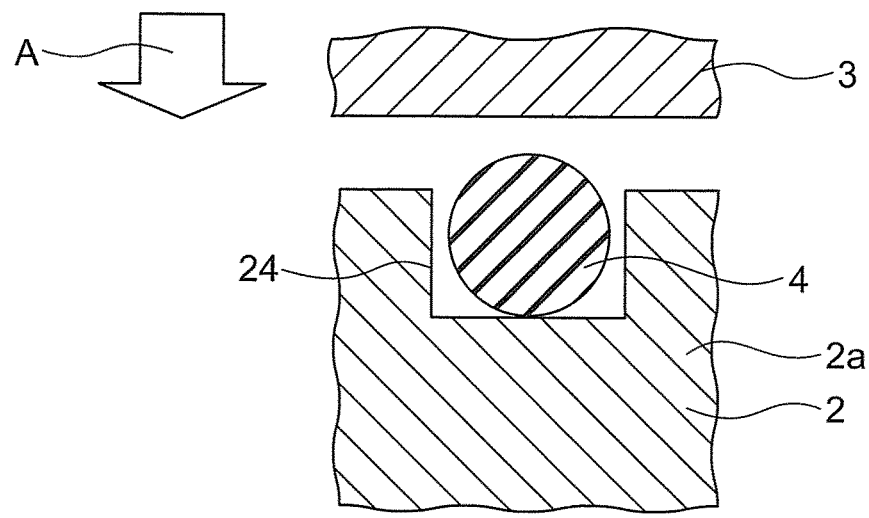
FIG. 2 is a sectional view taken along the line II-II in FIG. 1 when viewed in a direction of the arrows.
Figure 3:
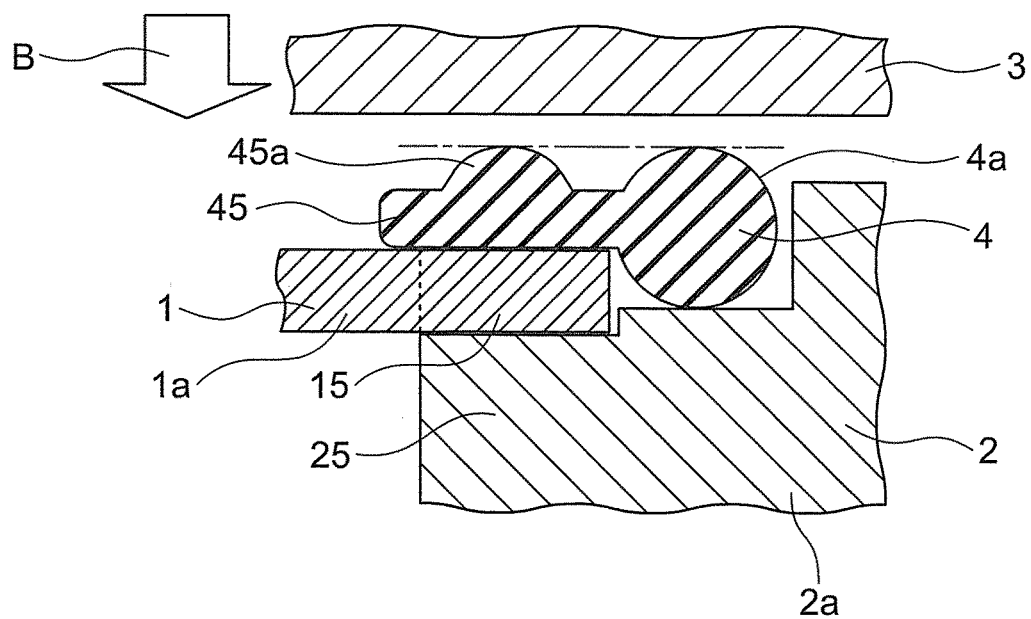
FIG. 3 is a sectional view taken along the line III-III in FIG. 1 when viewed in a direction of the arrows.

FIG. 1 is an exploded perspective view for illustrating the above-mentioned electronic device, FIG. 2 is a sectional view taken along the line II-II in FIG. 1 when viewed in a direction of the arrows, and FIG. 3 is a sectional view taken along the line III-III in FIG. 1 when viewed in a direction of the arrows.

The electronic device includes a printed circuit board 1 having a plurality of electronic circuit components including an electronic circuit element 11 joined by soldering at joining portions on both sides or one side, and a housing having the printed circuit board 1 received therein.

The housing includes a bottomed case main body 2 having an opening portion and serving as a first housing portion, a cover 3 serving as a second housing portion, for covering the opening portion of the case main body 2, case-and-cover fastening screws 31 serving as fastening members, for fastening the case main body 2 and the cover 3 to each other, and a rubber packing 4 having elasticity and serving as an annular sealing member, which is interposed between the case main body 2 and the cover 3. The rubber packing 4 is formed of an O-ring silicon rubber.

A mounting hole is formed in one side wall of the case main body 2, and a connector 21 is fitted into the mounting hole while securing waterproof property.

The connector 21 is electrically connected to a harness, a cable, and the like connected to an external device.

Connector terminals 22, which are components of the connector 21, are inserted into through holes 12 formed in the printed circuit board 1, and are then soldered to be electrically connected to an electronic circuit in the printed circuit board.

The case main body 2 includes a case main body portion 2a serving as a housing main body, and a plurality of case projecting portions 25 serving as housing protruding portions, which protrude inward from the case main body portion 2a. The plurality of case projecting portions 25, which are formed apart from each other, each have a columnar shape as illustrated in FIG. 1. The case main body portion 2a has a rubber packing insertion groove 24 serving as a seal insertion groove, which is formed over an entire circumference thereof.

The rubber packing insertion groove 24 is formed by a pair of opposing walls, and an inner wall thereof has a plurality of cutout portions 26 formed apart from each other.

In this case, in order to form the rubber packing insertion groove 24, it is desired that the case main body 2 be molded through metallic die casting such as aluminum die casting or using a resin molding technology.

Further, the cover 3 is required to squeeze the rubber packing 4 at a small number of screw-fastening positions, and hence it is desired to employ a material or structure having high rigidity.

Therefore, the cover 3 is illustrated in FIG. 1 as a simple flat plate. However, in order to secure rigidity, it is desired to secure the thickness of the cover 3 as required, or to adopt a reinforcement structure such as a rib structure.

The printed circuit board 1 includes a circuit-board main body 1a, and circuit-board projecting portions 15 serving as circuit-board protruding portions, which protrude outward from the circuit-board main body 1a to overlap with the case projecting portions 25.

A height position of the printed circuit board 1 inside the case main body 2 is determined when the printed circuit board 1 is placed on the columnar case projecting portions 25.

The printed circuit board 1 is generally a resin circuit board having a thickness of from about 1 mm to about 1.6 mm, and is mainly made of a glass epoxy resin material. Further, the printed circuit board 1 is electrically connected to the external device through intermediation of the connector 21 for the purpose of power supply, data input and output, or communication.

When each side of the printed circuit board 1 has a length of, for example, about 80 mm or less, adjacent circuit-board projecting portions 15 can be formed apart from each other only at about one or two positions in each side.

In this embodiment, the circuit-board projecting portions 15 are formed at two portions in each side, that is, a total of eight positions.

The rubber packing 4 includes a packing main body 4a serving as a seal main body, which is interposed between the case main body 2 and the cover 3, and packing projecting portions 45 serving as circuit-board holding portions, which protrude inward from the packing main body 4a. A total of eight packing projecting portions 45 are formed at positions overlapping with the circuit-board projecting portions 15 at intervals in a circumferential direction. Further, each of the packing projecting portions 45 includes a raised portion 45a raised up to a height equal to that of the packing main body 4a.

Next, description is made of a procedure of assembling the electronic device having the above-mentioned configuration.

First, the printed circuit board 1 is placed on the case main body 2 so that the circuit-board projecting portions 15 respectively overlap with the case projecting portions 25. At this time, distal end portions of the connector terminals 22 are inserted into the through holes 12 of the printed circuit board 1. Then, the distal end portions of the connector terminals 22 are soldered to the printed circuit board 1 so that the connector terminals 22 are electrically connected to the electronic circuit in the printed circuit board 1.

Next, the packing main body 4a is inserted into the rubber packing insertion groove 24 of the case main body 2. At this time, the packing projecting portions 45 protrude inward from the cutout portions 26 to overlap with the circuit-board projecting portions 15 of the printed circuit board 1.

Finally, the cover 3 is fastened to the case main body 2 with the case-and-cover fastening screws 31 tightened through screw holes 32 so that the rubber packing 4 is compressed due to a pressing force of the cover 3 in a direction indicated by the arrow A.

As a result, a squeeze is generated in the packing main body 4a of the rubber packing 4. Thus, the packing main body 4a of the rubber packing 4 has a waterproofing function to prevent entry of water to an inside of the housing.

Further, the packing projecting portions 45 of the rubber packing 4 are compressed due to a pressing force of the cover 3 in a direction indicated by the arrow B, and the circuit-board projecting portions 15 are pressed against the case projecting portions 25 due to the compressing force. Thus, the packing projecting portions 45 of the rubber packing 4 each have a function to hold the printed circuit board 1 inside the housing.

Next, description is made of an electronic device as a reference example of the electronic device of the first embodiment.

Figure 4:
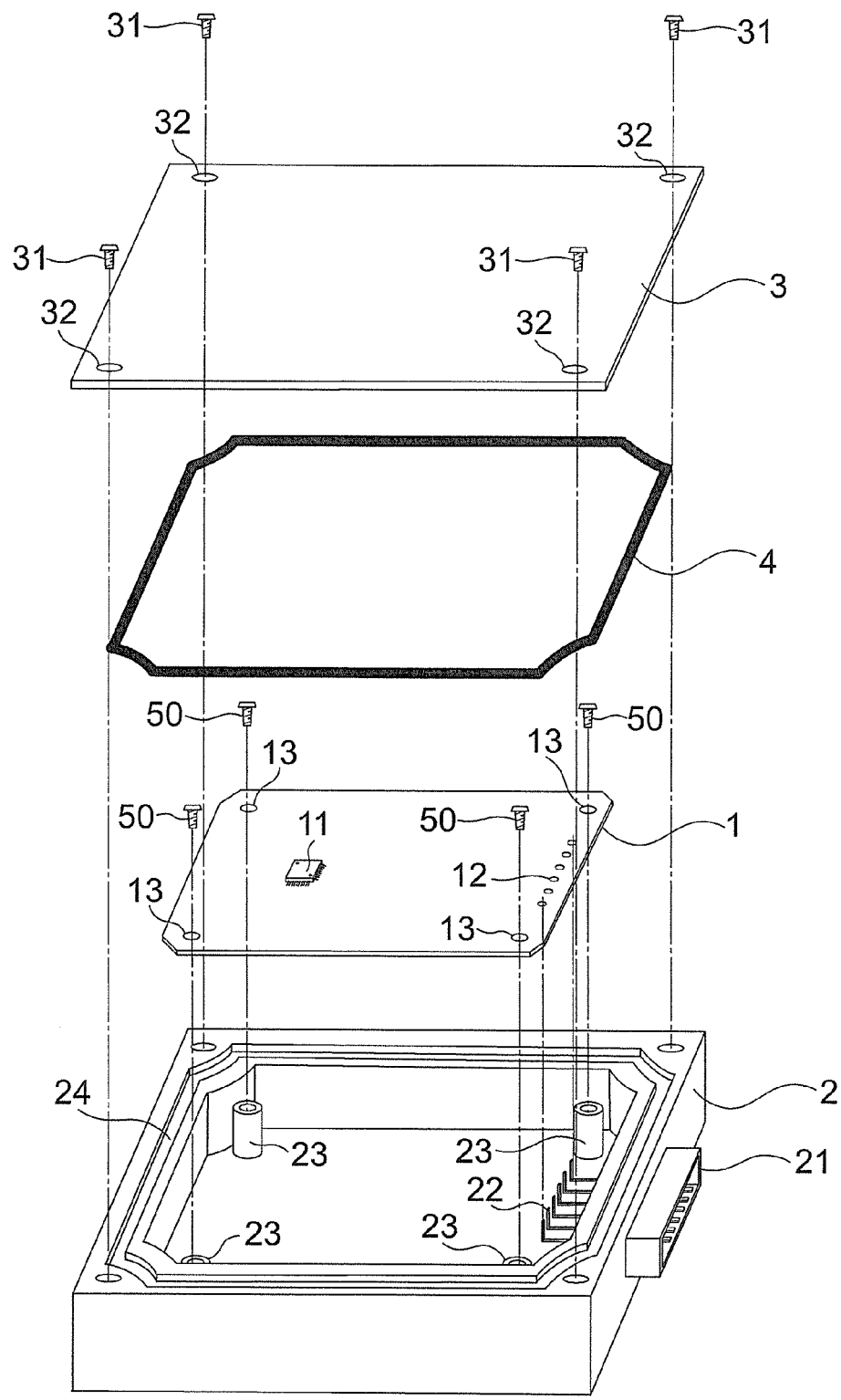
FIG. 4 is an exploded perspective view for illustrating the reference example.

FIG. 4 is an exploded perspective view for illustrating the reference example.

Note that, in FIG. 4, members and parts, which are the same as or correspond to those of the electronic device of the first embodiment, are denoted by the same reference symbols.

In the reference example, through holes 13 are formed in four corners of the printed circuit board 1, and fastening screws 50 are threadedly engaged with bosses 23 through the through holes 13 so that the printed circuit board 1 is fixed to the case main body 2.

Further, the cover 3 is fastened to the case main body 2 with the case-and-cover fastening screws 31. The rubber packing 4, which is inserted into the rubber packing insertion groove 24, is compressed through pressing by the cover 3 so that a squeeze is generated in the rubber packing 4, thereby preventing entry of water to the inside of the housing.

In the electronic device of the above-mentioned reference example, the printed circuit board 1 is fixed to the case main body 2 with the fastening screws 50. Thus, stress may be generated in the connector 21 and each of the joining portions of the electronic circuit components mounted on the printed circuit board 1 due to an error in dimensions including warpage of the printed circuit board 1 or an error in a mounting position of the printed circuit board 1, thereby causing breakage in each of the joining portions.

On the other hand, according to the electronic device of the first embodiment, the rubber packing 4 is elastically compressed due to fastening forces of the case-and-cover fastening screws 31, and the packing projecting portions 45 of the rubber packing 4 press the circuit-board projecting portions 15 against the case projecting portions 25, to thereby hold the printed circuit board 1 inside the housing.

Therefore, the rubber packing 4, which is interposed between the cover 3 and the printed circuit board 1, is elastically deformed to absorb the error in the dimensions including the warpage of the printed circuit board or the error in the mounting position of the printed circuit board, thereby preventing breakage in each of the above-mentioned joining portions.

Further, the printed circuit board 1 is not directly screw-fastened to the case main body 2, and hence the printed circuit board 1 is not warped due to a difference in thermal expansion between the printed circuit board 1 and the case main body 2 to which the printed circuit board 1 is mounted, thereby preventing breakage in each of the above-mentioned joining portions.

Further, the printed circuit board 1 is not directly screw-fastened to the case main body 2, and hence it is unnecessary to form the bosses 23 and secure spaces corresponding to the four corners of the printed circuit board 1 illustrated in FIG. 4, for directly screw-fastening the printed circuit board 1 to the case main body 2. Thus, the area of the printed circuit board 1 and the size of the housing can be reduced as compared to the electronic device of the reference example.

Further, the fastening screws 50 illustrated in FIG. 4 and the fastening steps therefor are also unnecessary, thereby being capable of achieving cost reduction.

Further, the case projecting portions 25, the packing projecting portions 45, and the circuit-board projecting portions 15 are respectively formed apart from each other. Thus, it is possible to correspondingly reduce materials used for the case main body 2, the rubber packing 4, and the printed circuit board 1, thereby being capable of achieving the cost reduction.

Further, in the inner wall of the pair of walls forming the rubber packing insertion groove 24, the cutout portions 26 are formed only in portions through which the packing projecting portions 45 are inserted.

Therefore, it is possible to suppress reduction in sealability for the housing, which is attained by the packing main body 4a inserted into the rubber packing insertion groove 24 and elastically compressed due to the fastening forces of the case-and-cover fastening screws 31.

Note that, in the above-mentioned embodiment, the first housing portion corresponds to the bottomed case main body 2 having the opening portion, and the second housing portion corresponds to the cover 3 for covering the opening portion. However, the above-mentioned configuration is an example. For example, both of the first housing portion and the second housing portion may be a bottomed case having an opening portion so that the opening portions are joined to each other, thereby constructing a housing.

Further, description is made of the case of using the plurality of case projecting portions 25 as the housing protruding portions, which are formed apart from each other, the plurality of packing projecting portions 45 as the circuit-board holding portions, which are formed apart from each other, and the plurality of circuit-board projecting portions 15 as the circuit-board protruding portions, which are formed apart from each other. However, the present invention is also applicable to an integrated configuration in which the adjacent case projecting portions 25, the adjacent packing projecting portions 45, and the adjacent circuit-board projecting portions 15 are continuously connected to each other, respectively.

Further, in the above-mentioned embodiment, description is made of the case where the distal end portions of the connector terminals 22, which pass through the through holes 12, are joined to the printed circuit board 1 by soldering. However, there may be employed a connector of a socket-insertion type in which a socket component is mounted on a surface of a printed circuit board in advance so that the connector is inserted from a lateral side at the time of assembling an electronic device, or a connector of a press-fit type in which soldering is unnecessary.

Further, the O-ring silicon rubber packing 4 is described as the sealing member. However, the rubber packing 4 is not limited to the O-ring, and may have a rectangular shape in cross section or an arbitrary projection shape may be added as long as the packing can secure waterproofness. Further, the material is not limited to the rubber, and may be, for example, a foamed resin having elasticity.

What is claimed is:

1. An electronic device, comprising:
  a printed circuit board having an electronic circuit component mounted thereon; and
  a housing having the printed circuit board received therein,
  the housing comprising:
    a first housing portion;
    a second housing portion arranged so as to be opposed to the first housing portion, for closing an inside of the housing in cooperation with the first housing portion;
    a fastening member for fastening the first housing portion and the second housing portion to each other; and
    an annular sealing member having elasticity, which is interposed between the first housing portion and the second housing portion,
  the first housing portion comprising:
    a housing main body; and
    a plurality of housing protruding portions protruding inward from the housing main body,
  the printed circuit board comprising:
    a circuit-board main body; and
    a plurality of circuit-board protruding portions protruding outward from the circuit-board main body to overlap with the housing protruding portions,
  the annular sealing member comprising:
    a seal main body interposed between the housing main body and the second housing portion; and
    a plurality of circuit-board holding portions formed at intervals in a circumferential direction of said annular sealing member and protruding inward from the seal main body to overlap with the circuit-board protruding portions, the annular sealing member being elastically compressed due to a fastening force of the fastening member so that the seal main body hermetically seals the inside of the housing, the circuit-board holding portions of the annular sealing member pressing the circuit-board protruding portions against the housing protruding portions, to thereby hold the printed circuit board inside the housing, the housing protruding portions being formed so as to be opposed to the circuit-board holding portions, and the circuit-board protruding portions being formed so as to be opposed to the circuit-board holding portions.

2. The electronic device according to claim 1, wherein the first housing portion comprises a bottomed case main body having an opening portion, wherein the housing main body comprises a case main body portion, wherein the housing protruding portions comprise case projecting portions, and wherein the second housing portion comprises a cover for covering the opening portion.

3. The electronic device according to claim 2, wherein the case main body portion comprises a seal insertion groove formed by a pair of opposing walls over an entire circumference of the case main body portion, for inserting the seal main body, and wherein an inner wall of the pair of opposing walls comprises cutout portions through which the circuit-board holding portions are inserted.

4. The electronic device according to claim 1, wherein the annular sealing member comprises a rubber packing.

5. The electronic device according to claim 1, wherein the annular sealing member comprises an O-ring.

6. An electronic device, comprising:

a printed circuit board having an electronic circuit component mounted thereon; and a housing having the printed circuit board received therein, the housing comprising:
  a first housing portion comprising: a bottomed case main body having a case main body portion and an opening portion; and a case protruding portion protruding inward from the case main body;
  a second housing portion arranged so as to be opposed to the first housing portion, for closing an inside of the housing in cooperation with the first housing portion, said second housing portion comprising a cover for covering the opening portion;
  a fastening member for fastening the first housing portion and the second housing portion to each other; and
  an annular sealing member having elasticity, which is interposed between the first housing portion and the second housing portion, the printed circuit board comprising:
  a circuit-board main body; and
  a circuit-board protruding portion protruding outward from the circuit-board main body to overlap with the case protruding portion, the annular sealing member comprising:
  a seal main body interposed between the case main body and the second housing portion; and
  a circuit-board holding portion protruding inward from the seal main body to overlap with the circuit-board protruding portion, the annular sealing member being elastically compressed due to a fastening force of the fastening member so that the seal main body hermetically seals the inside of the housing, and the circuit-board holding portion of the annular sealing member pressing the circuit-board protruding portion against the case protruding portion, to thereby hold the printed circuit board inside the housing, wherein the case main body portion comprises a seal insertion groove formed by a pair of opposing walls over an entire circumference of the case main body portion, for inserting the seal main body, and wherein an inner wall of the pair of opposing walls comprises a cutout portion through which the circuit-board holding portion is inserted.

7. An electronic device, comprising:

a printed circuit board having an electronic circuit component mounted thereon; and a housing having the printed circuit board received therein, the housing comprising:
  a first housing portion
  a second housing portion arranged so as to be opposed to the first housing portion, for closing an inside of the housing in cooperation with the first housing portion;
  a fastening member for fastening the first housing portion and the second housing portion to each other; and
  an annular sealing member having elasticity, which is interposed between the first housing portion and the second housing portion, the first housing portion comprising:
  a housing main body; and
  a housing protruding portion protruding inward from the housing main body, the printed circuit board comprising:
  a circuit-board main body; and
  a circuit-board protruding portion protruding outward from the circuit-board main body to overlap with the housing protruding portion, the annular sealing member comprising:
  a seal main body interposed between the housing main body and the second housing portion; and
  a circuit-board holding portion protruding inward from the seal main body to overlap with the circuit-board protruding portion, the annular sealing member being elastically compressed due to a fastening force of the fastening member such that the seal main body hermetically seals the inside of the housing, and the circuit-board holding portion of the annular sealing member pressing the circuit-board protruding portion against the housing protruding portion, to thereby hold the printed circuit board inside the housing, wherein the housing main body comprises a seal insertion groove formed by a pair of opposing walls over an entire circumference of the housing main body, for inserting the seal main body, and wherein an inner wall of the pair of opposing walls comprises a cutout portion through which the circuit-board holding portion is inserted.

* * * * *